(12) United States Patent
Wollweber et al.

(10) Patent No.: US 6,663,711 B1
(45) Date of Patent: Dec. 16, 2003

(54) GROWTH IN SOLUTION IN A FLOAT ZONE OF CRYSTALS OF A COMPOUND OR AN ALLOY

(75) Inventors: Jürgen Wollweber, Berlin (DE); Thierry Duffar, Grenoble (FR); Jean-Louis Santailler, Moirans (FR); Véronique Chevrier, Pessac (FR)

(73) Assignee: Commissarat a l'Energie Atomique, Paris (FR)

( * ) Notice: Subject to any disclaimer, the term of this patent is extended or adjusted under 35 U.S.C. 154(b) by 0 days.

(21) Appl. No.: 10/049,946

(22) PCT Filed: Sep. 27, 2000

(86) PCT No.: PCT/FR00/02667
§ 371 (c)(1), (2), (4) Date: Feb. 20, 2002

(87) PCT Pub. No.: WO01/23647
PCT Pub. Date: Apr. 5, 2001

(30) Foreign Application Priority Data

Sep. 28, 1999 (EP) .............................................. 99402362

(51) Int. Cl.$^7$ .............................................. C30B 25/04
(52) U.S. Cl. .............................. 117/37; 117/40; 117/49; 117/51
(58) Field of Search .............................. 117/37, 40, 49, 117/51

(56) References Cited

FOREIGN PATENT DOCUMENTS

DE          1196625         7/1965
JP          58060699        4/1983

OTHER PUBLICATIONS

Gillesen, et al., "Growth of Silicon Carbide from Liquid Silicon by a Travelling Heater Method", vol 19, 1973, 6 pages.
Norlund, et al., "Crystal Growth of Incongruently Melting Compounds", vol. 62, No. 2, 1983, 9 pages.
Wollweber, et al., "$Si_xGe_{1-x}$ single crystals grown by the RF–heated float zone technique", vol. 163, No. 3, 6 pages.
Honda, et al., "Growth and Characterization of Bulk Si–Ge Single Crystals", vol. 35, No. 12A, 6 pages.
Barz, et al., "Germanium–rich SiGe bulk single crystals grown by the vertical Bridgman method and by zone melting", vol. 16, No. 5, 4 pages.

*Primary Examiner*—Felisa Hiteshew
(74) *Attorney, Agent, or Firm*—Thelen Reid & Priest LLP; Robert E. Krebs

(57) ABSTRACT

A process produces a crystal of a material with non-congruent melting using at least one first element and a second element. The process includes (a) placing, in a vertical alignment and maintaining under a controlled atmosphere, a bar of the first element gripped between a lower bar and an upper bar made out of the material, (b) transforming the bar of the first element into a floating zone by heating to a temperature that avoids the evaporation of the first element, the heating being obtained by heating means that provides a temperature gradient in the floating zone so that the lower face of the upper bar appears as a cold face, and (c) contra-rotating the lower and upper bars around the alignment axis and moving the whole bar assembly upwards in relation to the heating means in order to obtain the crystal on the cold face by growth in solution.

28 Claims, 1 Drawing Sheet

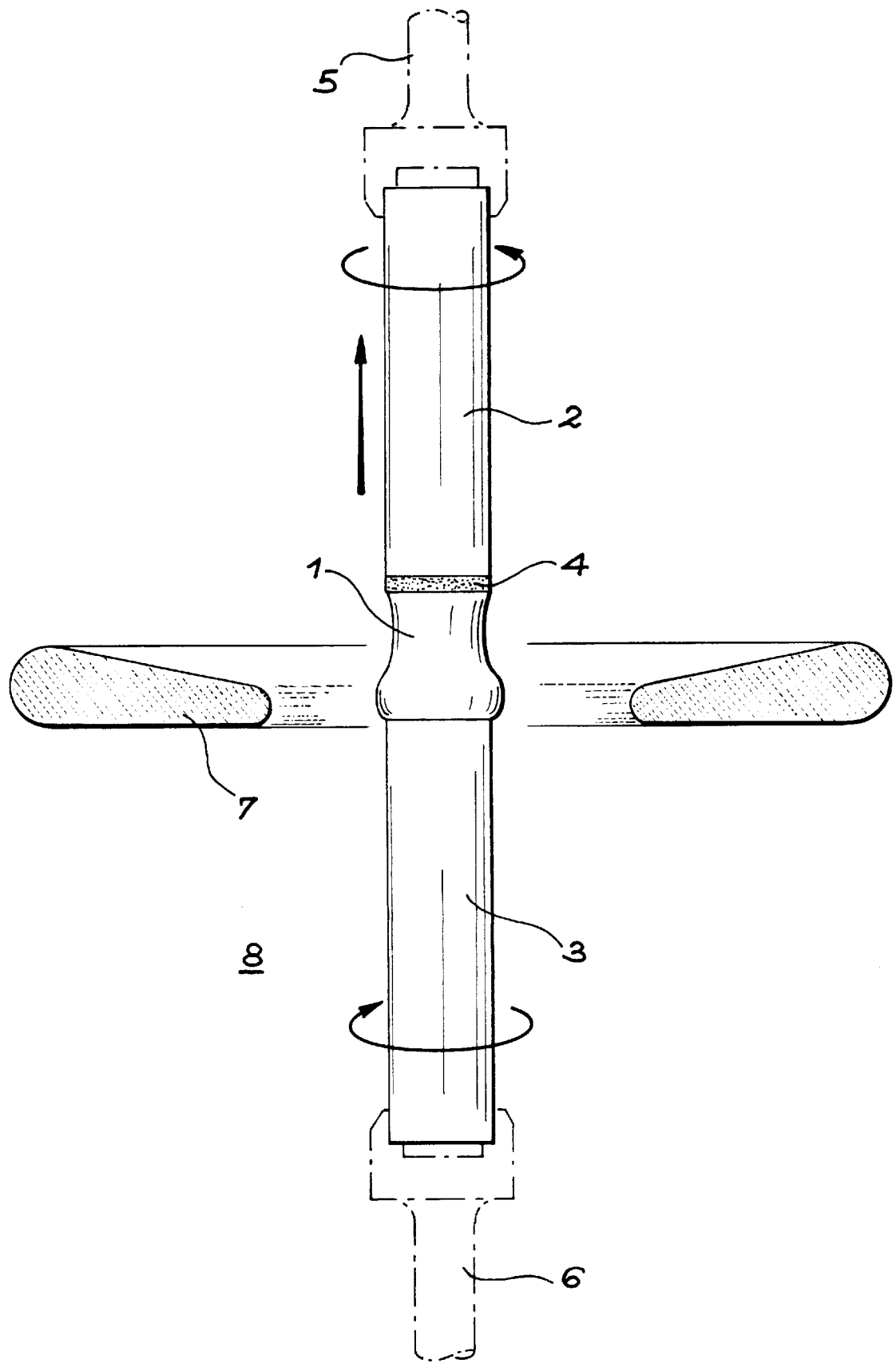

GROWTH IN SOLUTION IN A FLOAT ZONE OF CRYSTALS OF A COMPOUND OR AN ALLOY

This application is a national phase of PCT/FR00/02667 which was filed on Sep. 27, 2000, and was not published in English.

1. Technical Field

The present invention concerns the growth., in solution in a floating zone, of crystals of a compound or alloy. It concerns in particular the growth of crystals of silicon carbide.

2. State of the Prior Art

Silicon carbide is a material that is being used more and more in the semiconductors field. It can be produced in the form of layers or in a bulk by growth in the vapour phase according to what is termed the Lely method. This method produces good quality crystals but has the disadvantage of, using very high temperatures (greater than 2000° C.).

Another process has been proposed that allows lower temperatures to be used. This process is described in the article "Growth of Silicon Carbide from Liquid Silicon by a Travelling Heater Method" by K. GILLESSEN and W. von MUNCH, which was published in the Journal of Crystal Growth, 19 (1973), pages 263–268. The authors propose creating, via induction heating, a liquid solvent zone, as it happens silicon, between two bars of polycrystalline silicon carbide placed in a vertical alignment. The production of a floating zone of silicon by induction is a technique fully mastered by those skilled in the art. The growth conditions are such that the process is used in a sealed quartz ampoule. In fact, a temperature of 1800° C. is necessary at the top of the liquid zone and iodine is added to offset the consequent significant evaporation of silicon. The transfer reaction that takes place between the iodine and the silicon in the gas phase means that a sealed system must be used.

A slow upwards movement of the ampoule causes an asymmetric distribution in the temperature within the liquid zone, which sets off the transfer of silicon carbide from the lower bar towards the upper bar where a solid crystal is obtained.

This process has a certain number of disadvantages, which can be summarised as follows: the constraints linked to the growth in an ampoule, the problems caused by the addition of iodine and those due to the relatively high temperature.

The ampoule has to be prepared beforehand. All of the components have to be integrated into the ampoule, with the difficulty of correctly aligning the two bars, and achieving the de-gassing and the sealing. The size of the ampoule has to be taken into account: for a given diameter of induction coil, the dimension of the crystals that are obtained is inevitably smaller than the dimensions one would expect without an ampoule. Moreover, an optimal charge—wall distance for the ampoule must be found and maintained. It is also necessary to work with very pure components in order to avoid impurities being deposited on the walls of the ampoule. The presence of an ampoule implies more complicated thermal phenomena and therefore more difficult temperature control.

The addition of iodine also causes problems. In order to avoid condensation of the iodine on the walls of the ampoule, it must be maintained at sufficiently high temperature (temperature at the coldest point: 700° C.). The use of second heating system, in addition to the induction coil, therefore makes the assembly more complex. In addition, the possible insertion of iodine into the crystals obtained may have a harmful effect in subsequent applications of the crystals.

Furthermore, 3C polytype SiC crystals are more easily obtained at lower temperatures because they are more stable. This is an important limitation in the process.

DESCRIPTION OF THE INVENTION

According to the present invention, it is proposed to achieve the growth of the material that one wants to obtain at a sufficiently low temperature so that the phenomenon of evaporation becomes negligible. In the case where silicon carbide crystals are produced, adding iodine and using an ampoule become unnecessary.

The object of the invention is therefore a process for the production of a crystal of a material with non-congruent melting and which is made from at least one first element and a second element, with the process comprising the following stages:

Placing, in a vertical alignment, and maintaining under a neutral atmosphere :or under vacuum, a bar of the first element gripped between a lower bar and an upper bar made out of said material.

Transforming the bar of the first element into a floating zone by heating to a temperature that avoids the evaporation of the first element, the heating being obtained by heating means that provides a temperature gradient in the floating zone so that one of the faces of either the lower or upper bars that are in contact with the bar of the first element appears as a cold face.

Contra-rotating the; lower and upper bars around the alignment axis and moving the whole bar assembly along the alignment axis in relation to the heating means in order to move the cold face further away and thus produce said crystal on the cold face by growth in solution.

The bars that are put in place may be maintained under an argon blanket.

The heating may be obtained via induction produced, for example, by a flat coil that encircles the bar of the first element. It may also be obtained by means of a mirror oven.

The growth of said crystal may be achieved from a seed deposited on the lower face of the upper bar or on the upper face of the lower bar.

The process may be advantageously used to obtain a crystal of silicon carbide, the bar of the first element being silicon, with the upper and lower bars being made out of polycrystalline silicon carbide obtained, for example, by powder sintering or by sublimation. In particular, it allows crystals of 3C polytype silicon carbide to be obtained. It may also be used for obtaining silicon nitride or a Si—Ge alloy.

The invention also concerns a device for the production of crystals of: a material with non-congruent melting and made from at least one first element and a second element, with the device comprising:

an enclosure that can be put under vacuum or under a neutral blanket.

means for maintaining, in the enclosure and in a vertical alignment, an assembly comprising a bar of the first element gripped between a lower bar and an upper bar made out of said material, with said means also allowing the lower and upper bars to be contra-rotated around the alignment axis.

heating means that makes it possible to transform the bar of the first element into a floating zone by heating while providing a temperature gradient in the floating zone so that one of the faces of either the upper or lower bars that is in contact with the bar of the first element appears as a cold face.

means for achieving a relative displacement, along the alignment axis, of the bar assembly in relation to the heating means, in order to move the cold face away.

The neutral atmosphere in the enclosure may be obtained via an argon blanket.

The heating means may be induction heating means. They may, for example, comprise a flat coil encircling said bar of the first element. They may also comprise a mirror oven.

BRIEF DESCRIPTION OF THE DRAWINGS

The invention will be more clearly understood and other advantages will become apparent by reading the description that follows, given as an example and in no way limiting, and by referring to the annexed drawing, which illustrates how a crystal is obtained through growth in solution in a floating zone, according to the invention.

DETAILED DESCRIPTION OF AN EMBODIMENT OF THE INVENTION

The annexed FIGURE shows, in a vertical alignment, a bar of un-doped silicon 1 held in place between two bars of polycrystalline silicon carbide: an upper bar 2 and a lower bar 3. Since the desired crystal has to grow on the upper bar 2, it is preferable to fasten a seed of SiC 4 onto the lower end of the upper bar 2. The process takes place in a sealed enclosure, not shown, under an argon blanket 8.

An induction coil 7 allows the silicon in the bar 1 to be melted, which then becomes a solvent for SiC. The induction coil 7 is centred around the vertical alignment axis and is positioned so as to achieve a temperature gradient in the floating zone made up of the melted material of bar 1, the lower face of the upper bar 2 appearing as a cold face.

The upper bar 2 is maintained and rotated around itself and around the vertical alignment axis by an appropriate component 5. The lower bar 3 is maintained and rotated around itself and around the vertical alignment axis by an appropriate component 6, the rotation being in the opposite direction to that of the component 5. When in operation, components 5 and 6 force the bar assembly to move upwards.

The rotation in the opposite direction of the upper bar 2 and lower bar 3 makes it possible firstly to homogenise the melted material and secondly to accelerate, within this melted material, the transfer of the SiC and/or carbon. Thus, despite a relatively low growth temperature (sufficiently low for the evaporation of the silicon to be negligible) and therefore a low solubility of the carbon in the silicon, reasonable growth speeds can be attained.

By way of example, the upper 2 and lower 3 bars may be made out of polycrystalline SiC obtained by powder sintering. Their diameter may be 10 mm. The height of the melted zone of silicon may be around 7 mm. The induction coil 7 is a "pancake" type of flat coil, with an internal diameter of 22 mm. It is powered by an alternating current of 3 MHz. The argon pressure in the working enclosure is normal atmospheric pressure.

The speed of rotation of the upper and lower bars may be 20 rpm and the movement of the bar assembly may be at a speed of 0.1 mm/hour. The temperature gradient around the growth interface is less than 100 K/mm, and typically several tens of K/mm, for example 15 K/mm.

In this way one may obtain, with a device that is a lot simpler than the devices of the previous art, the effective growth of 3C polytype silicon carbide, which is an appreciable advantage. In fact, amongst the most common silicon carbide polytypes, 3C polytype has the highest electronic mobility, which further enlarges the range of its applications.

It is possible to apply this process to the growth of crystals of other materials with non-congruent melting such as silicon nitride $Si_3N_4$ or alloys such as, for example, Si—Ge.

What is claimed is:

1. A process for the production of a crystal of a material with non-congruent melting, made from at least one first element and a second element, with the process comprising the following stages:

Placing, in a vertical alignment, and maintaining under a neutral atmosphere or under vacuum, a bar of the first element gripped between a lower bar and an upper bar made out of said material;

Transforming the bar of the first element into a floating zone by heating to a temperature that avoids the evaporation of the first element, the heating being obtained by heating means that provides a temperature gradient in the floating zone so that one of the faces of either the lower bar or the upper bar, which are in contact with the bar of the first element, appears as a cold face; and Contra-rotating the lower and uppers bars around the alignment axis and moving the whole bar assembly along the alignment axis in relation to the heating means in order to move the cold face away and obtain said crystal, on the cold face, by growth in solution.

2. Process according to claim 1, in which the said bars that are put in place are maintained under an argon blanket.

3. Process according to claim 2, in which the heating is obtained by induction means.

4. Process according to claim 2, in which heating is obtained by means of a mirror oven.

5. Process according to claim 1, in which the heating is obtained by induction means.

6. Process according to claim 5, in which the heating is obtained by induction means produced by a flat coil encircling said bar of the first element.

7. Process according to claim 1, in which heating is obtained by means of a mirror oven.

8. Process according to claim 7, in which the growth of said crystal is achieved from a see deposited on the lower face of the upper bar.

9. Process according to claim 7, in which the growth of said crystal is achieved from a seed deposited on the upper face of the lower bar.

10. Process according to claim 1, in which the growth of said crystal is achieved from a seed deposited on the lower face of the upper bar.

11. Process according to claim 1, in which the growth of said crystal is achieved from a seed deposited on the upper face of the lower bar.

12. Process according to claim 11 for the production of a crystal of silicon carbide, with the bar of the first element being made out of silicon and the lower and the bars being made out of polycrystalline silicon carbide.

13. Application of the process according to claim 11 for the production of silicon nitride.

14. Application of the process according to claim 11 for the production of Si—Ge alloy.

15. Process according to claim 1 for the production of a crystal of silicon carbide, with the bar of the first element being made out of silicon and the lower and upper bars being made out of polycrystalline silicon carbide.

16. Application according to claim 15, in which the lower and upper bars made out of polycrystalline silicon carbide are obtained by powder sintering.

17. Application according to claim 15, in which the lower and upper bars made out of polycrystalline silicon carbide are obtained by sublimation.

18. Application according to claim 17 for the production of a crystal of 3C polytype silicon carbide.

19. Application according to claim 15 for the production of a crystal of 3C polytype silicon carbide.

20. Application of the process according to claim 1 for the production of silicon nitride.

21. Application of the process according to claim 1 for the production of a Si—Ge alloy.

22. A device for the production of a crystal of a material with non-congruent melting and made from at least one first element and a second element, with the device comprising:

an enclosure that can be maintained under a neutral blanket or under vacuum, means for maintaining, in the enclosure and in a vertical alignment, an assembly comprising a bar of the first element gripped between a lower bar and an upper bar made out of said material, with said means also allowing the lower and upper bars to be contra-rotated around the alignment axis, heating means that makes it possible to transform the bar of the first element into a floating zone by heating while providing a temperature gradient in the floating zone so that one of the faces of either the upper or lower bars that is in contact with the bar of the first element appears as a cold face, means for displacing the bar assembly along the alignment axis in relation to the heating means in order to move away the cold face.

23. Device according to claim 22, in which said neutral atmosphere in the enclosure is an argon blanket.

24. Device according to claim 23, in which the heating means is induction heating means.

25. Device according to claim 23, in which the heating means comprises a mirror oven.

26. Device according to claim 22, in which the heating means is induction heating means.

27. Device according to claim 26, in which the induction heating means comprises a flat coil encircling said bar of the first element.

28. Device according to claim 22, in which the heating means comprises a mirror oven.

* * * * *